US005509597A

United States Patent [19]
Laferriere

[11] Patent Number: 5,509,597
[45] Date of Patent: Apr. 23, 1996

[54] APPARATUS AND METHOD FOR AUTOMATIC MONITORING AND CONTROL OF A SOLDERING PROCESS

[75] Inventor: Paul Laferriere, Somerville, Mass.

[73] Assignee: Panasonic Technologies, Inc., Secaucus, N.J.

[21] Appl. No.: 323,822

[22] Filed: Oct. 17, 1994

[51] Int. Cl.$^6$ .................................................. H05K 3/34
[52] U.S. Cl. .................. 228/105; 228/180.22; 228/248.1; 219/121.62
[58] Field of Search ................................. 228/102, 105, 228/180.22, 248.1; 356/394; 250/338.1, 341.8; 219/121.62, 121.66, 121.83

[56] References Cited

U.S. PATENT DOCUMENTS

| | | | |
|---|---|---|---|
| 3,803,413 | 4/1974 | Vanzetti et al. | 250/338.1 |
| 4,481,418 | 11/1984 | Vanzetti et al. | 250/338.1 |
| 4,531,044 | 7/1985 | Chang | 219/121.63 |
| 4,657,169 | 4/1987 | Dostoomian et al. | 228/103 |
| 4,893,742 | 1/1990 | Bullock | 228/180.5 |
| 4,914,272 | 4/1990 | Ito et al. | 219/121.63 |
| 4,963,714 | 10/1990 | Adamski et al. | 219/121.63 |
| 4,980,971 | 1/1991 | Bartschat et al. | 29/833 |
| 4,988,202 | 1/1991 | Nayar et al. | 356/394 |
| 5,023,426 | 6/1991 | Prokosch et al. | 219/121.63 |
| 5,055,652 | 10/1991 | Jones et al. | 219/121.64 |
| 5,064,291 | 11/1991 | Reiser | 356/372 |
| 5,122,635 | 6/1992 | Knodler et al. | 219/121.63 |
| 5,185,811 | 2/1993 | Beers et al. | 382/151 |
| 5,233,152 | 8/1993 | Prokosch et al. | 219/121.63 |

Primary Examiner—Samuel M. Heinrich
Attorney, Agent, or Firm—Ratner & Prestia

[57] ABSTRACT

Apparatus and method for soldering a first material to a second material uses a laser and involves applying solder paste over the first material, placing the second material on the solder paste in alignment with the first material to form a sample, and focusing a laser beam onto a predetermined location on the sample to segment the solder paste and form a solder joint between the first material and the second material. During the soldering, optical images of at least one region-of-interest in the solder paste adjacent the solder joint are captured. Formation of the solder joint is monitored by repeatedly calculating pixel value sums in the region-of-interest from the optical images to determine whether the solder paste in the region-of-interest has segmented. Control signals may be generated based on the pixel value sums and used to adjust at least one of the intensity and duration of the laser beam.

2 Claims, 2 Drawing Sheets

APPARATUS AND METHOD FOR AUTOMATIC MONITORING AND CONTROL OF A SOLDERING PROCESS

FIELD OF THE INVENTION

This invention relates to laser or optical soldering and, more particularly, to real-time monitoring and feedback control of the soldering process.

BACKGROUND OF THE INVENTION

Optical soldering is a process in which lamp or laser energy is used to form solder connections between two materials. A light beam is focused at desired locations on the materials. The light beam heats the materials and any solder between them to form the solder connections. A plurality of solder connections are generally serially formed in optical soldering processes.

Optical soldering is attractive because it offers the promise of automation. Features of optical soldering, such as a locally applied heat source with an intensity that may be varied rapidly, lend themselves to automation. This is especially true of laser soldering. In order to exploit this capability for automation, it is necessary to monitor the formation of the solder joint. Typically, solder joint formation takes from 0.2 to 2.0 seconds in a laser soldering process.

Previously, single-element sensors which measure the amount of thermal radiation emitted by a solder joint have been used to monitor solder joint formation. Examples of this technique are found in U.S. Pat. Nos. 3,803,413 to Vanzetti et al., 4,481,418 to Vanzetti et al., and 4,657,169 to Dostoomian et al. The detected radiation values in these systems are compared to standards to yield information about the solder joint. In the Dostoomian patent, for example, the radiation values are used to determine the phase of the solder in a reflow soldering operation. This information is then used to manipulate the soldering process.

The information available from thermal radiation from the solder joint is limited, however. The available information depends on many factors, such as the emittance of the target and the background thermal radiation that is present. In addition, radiation detection systems require infrared optics and other specialized equipment.

SUMMARY OF THE INVENTION

The present invention provides an apparatus and method for soldering a first material to a second material using a laser that involves applying solder paste over the first material, placing the second material on the solder paste in alignment with the first material to form a sample, and focusing a laser beam onto a predetermined location on the sample to segment the solder paste and form a solder joint between the first material and the second material. During the soldering, optical images of at least one region-of-interest in the solder paste adjacent the solder joint are captured. Formation of the solder joint is monitored by repeatedly calculating pixel value sums in the region-of-interest from the optical images to determine whether the solder paste in the region-of-interest has segmented. Control signals may be generated based on the pixel value sums and used to adjust at least one of the intensity and duration of the laser beam.

DETAILED DESCRIPTION OF THE INVENTION

This invention involves a technique for automatically monitoring a laser soldering process by analyzing optical images of the process which are repeatedly generated during the soldering. The image data is used to determine when the soldering is completed. Previous systems, such as those using thermal detectors, often include imaging systems for other purposes, such as alignment and post-soldering inspection. The imaging system of the present invention is used as the sensor for monitoring the actual soldering process. Referring to the exemplary embodiment illustrated in FIGS. 1(a) and 1(b), the present invention will now be described in detail.

Figure 1A:
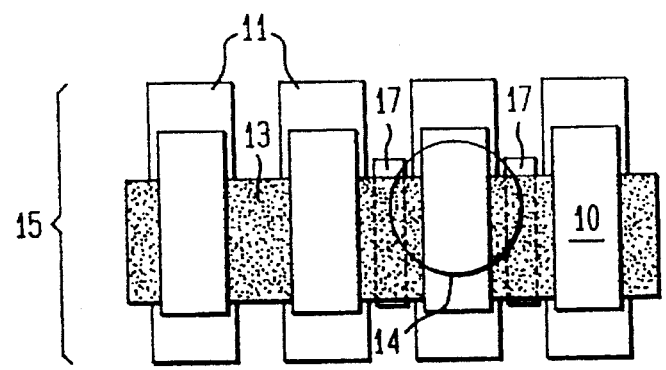
FIGS. 1(a) and 1(b) are partial plan views of an exemplary sample before and after solder joint formation according to the present invention.
Figure 1B:
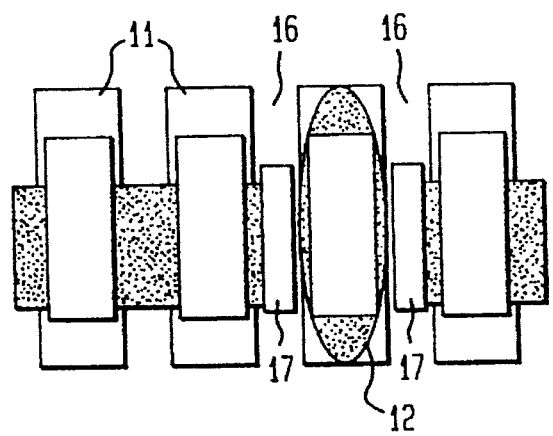

FIGS. 1(a) and 1(b) illustrate the operation of one embodiment of the present invention wherein a surface mount technology chip (not shown) having leads 10 is soldered to a circuit board (not shown) having pads 11. Solder joints 12 are formed to connect each lead 10 with a respective one of the circuit board pads 11.

To form solder joints 12, solder paste is first applied in a continuous solder paste bead 13 over circuit board pads 11. Solder paste bead 13 is a mixture of solder alloy particles, a tin/lead alloy in the exemplary embodiment, and flux. The volume of solder paste bead 13 on circuit board pads 11 depends on the size of solder joint 12 that is to be formed—the larger the joint, the thicker the solder paste 13 is applied. Solder paste bead 13 may be applied with a syringe or stenciled onto circuit board pads 11. Typically, though not intending to so limit the invention, solder paste bead 13 is less than 1 mm thick, and usually about 0.5 mm.

The surface mount chip is then placed on top of solder paste bead 13, with each lead 10 of the surface mount chip being aligned with a corresponding circuit board pad 11. The surface mount chip, the solder paste bead 13, and the circuit board constitute a sample 15.

A beam of light is then focused into a light spot 14 at a predetermined location on sample 15. This predetermined location is where a solder joint 12 is to be formed. Upon being heated by light spot 14, continuous solder paste bead 13 segments into discrete solder joints 12. As continuous solder paste bead 13 segments, it withdraws from the spaces 16 between circuit board pads 11. When solder paste bead 13 withdraws from the spaces 16, solder joint 12 is completed.

To monitor the formation of solder joint 12, regions-of-interest 17 are selected in spaces 16 on either or both sides of the predetermined location where solder joint 12 is to be formed. Regions-of-interest 17 may be selected by human interaction with software, such as by dragging a mouse over the regions-of-interest 17 on a monitor of a personal computer. Alternatively, preprogrammed pattern recognition techniques may be used to identify regions-of-interest 17 using fiducial marks on the circuit board. An image of regions-of-interest 17 is then captured and digitized, before application of light spot 14 to sample 15, by any standard CCD camera known in the art.

Regions-of-interest 17 are divided into pixels. An important consideration for pixel resolution is that the optical system must give sufficient magnification that individual leads 10 may be discerned. Although fewer pixels increases computer operation time, enough pixels must be selected to provide proper resolution. The sum of the pixel values in region-of-interest 17 are computed. This sum reflects the total pixel value in region-of-interest 17 when continuous solder paste bead 13 is still in region-of-interest 17, which is before soldering begins. This sum is used as the basis for calculating changes in solder paste bead 13 as reflected in the pixel values in region-of-interest 17.

Light spot 14 is then focused on sample 15 to begin the soldering process. This may be done, for example, by turning on a laser. Typically, the duration of laser illumination is 0.2–2.0 seconds. While the laser is on and light spot 14 is focused on sample 15, a camera (not shown) captures optical images of region-of-interest 17. The pixel value sums in region-of-interest 17 are repeatedly computed in real-time (approximately 30 Hz), or faster, during the soldering process.

Based on the pixel value sum changes in region-of-interest 17, it can be determined whether and to what extent solder paste bead 13 has withdrawn from region-of-interest 17. This in turn indicates the progress of the formation of solder joint 12. Control signals may be generated based on the pixel value sum changes to adjust laser power as necessary to optimize the soldering process. Once a first solder joint 12 is formed, light spot 14 is serially applied to each lead 10 to repeat the process and connect each to a circuit board pad 11. New regions-of-interest 17 are selected and pixel value sums analyzed for each solder joint 12 to be formed.

FIG. 1(a) shows sample 15 immediately after application of light spot 14 before any soldering occurs. FIG. 1(b) shows sample 15 after solder joint 12 is formed and solder paste bead 13 has withdrawn from regions-of-interest 17.

Using this invention, simple operations such as maximum, minimum, and average pixel values in appropriately defined regions-of-interest can provide a great deal of information about the soldering process with manageable computational cost.

Figure 2:
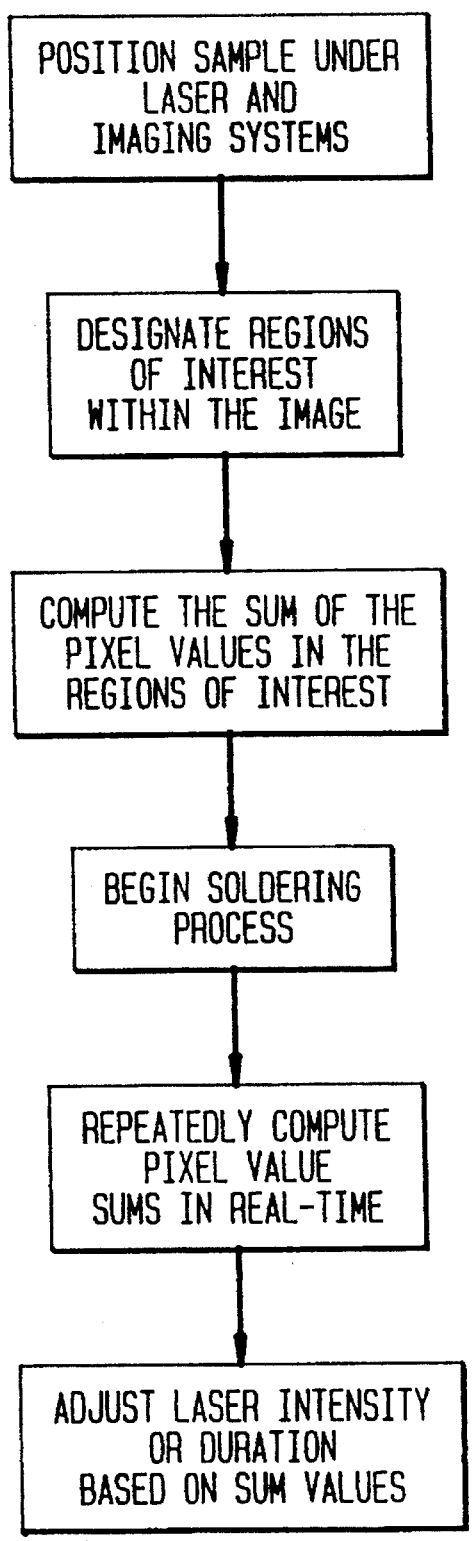
FIG. 2 is a schematic flow chart of an exemplary method according to the present invention.

The method for automatic recognition of when solder paste bead 13 segments by repeatedly calculating pixel sum values in regions-of-interest 17 may be implemented using software on a personal computer, as understood by those skilled in the art. FIG. 2 is a flow chart illustrating an exemplary method according to the present invention which can be implemented in software. As shown in FIG. 2, the sample is positioned under the laser and the imaging systems; regions of interest are designated within the image produced by the imaging system; the sum of the pixel values in the regions of interest are computed; the soldering process is commenced; the pixel value sums are repeatedly computed in :real time; and laser intensity or duration or both are adjusted based on the sum values.

Recent advancements in personal computer related technology now permit data transfer and processing at the speeds required for the invention. By keeping the mathematical operations simple, the required real-time speed can be achieved on newly available personal computer components, such as Intel Pentium-based machines with the PCI bus.

The solder joint monitoring process of this invention is best suited for use when the underlying surface of the circuit board in space 16 and the solder paste bead 13 have distinguishable gray levels. If the gray levels are too close, the recognition of pixel value change becomes more difficult. In that case, a variety of color-based techniques may be used to aid discriminating between the solder paste and the underlying circuit board. Such techniques include, for example, using colored light illumination, using color filters in front of a monochrome CCD camera, or using a color CCD camera in combination with an electronic color filter.

Figure 3:
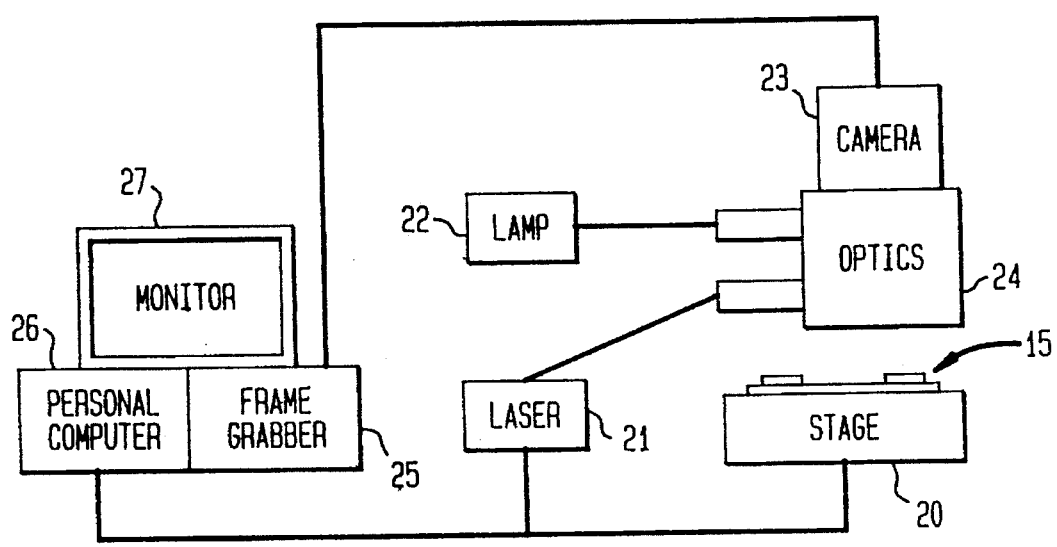
FIG. 3 is a schematic representation of one embodiment of a laser soldering system according to the present invention.

FIG. 3 illustrates an exemplary laser soldering system embodying the present invention. Sample 15 rests on sample stage 20, which may be movable in two, or possibly three, directions to adjust the position of sample 15.

Laser 21, lamp 22, and camera 23 are all focused onto sample 15 by optics section 24. Laser 21 may be a laser diode or a conventional laser. Camera 23 may be a conventional CCD camera. Optics section 24 includes conventional lenses and mirrors used to focus the light and images.

A frame grabber 25 captures and digitizes images from camera 23. These images are analyzed by a personal computer 26. The data from the digitized images that is analyzed by personal computer 26 is the pixel value sums that are repeatedly calculated for the regions-of-interest in the images. Based on the analysis performed by personal computer 26, control signals may be generated by personal computer 26 to adjust the power to the laser or the position of stage 20, or both, according to techniques known in the art.

In the embodiment shown in FIG. 3, software is present to allow a live image from camera 23 to be displayed on a monitor 27 of personal computer 26. Central features of the exemplary system shown in FIG. 3 are that camera 23 observes sample 15 while soldering is occurring, and that frame grabber 25 allows image data from camera 23 to be digitized and analyzed by personal computer 26.

While the present invention has been described in terms of exemplary embodiments, it is contemplated that it may be practiced as outlined above with modifications that are within the spirit and scope of the appended claims.

What is claimed:

1. A method for soldering a first material to a second material using a laser comprising the steps of:
    (a) applying solder paste over said first material;
    (b) disposing said second material on said solder paste in alignment with said first material to form a sample;
    (c) focusing a laser beam onto a predetermined location on said sample to segment said solder paste and form a solder joint between said first material and said second material;
    (d) capturing optical images of at least one region-of-interest in said solder paste adjacent said solder joint during said soldering; and
    (e) monitoring formation of said solder joint by repeatedly calculating pixel value sums in said region-of-interest from said optical images to determine whether said solder paste in said region-of-interest has segmented.

2. A method as claimed in claim 1 further comprising the steps of:
    (a) generating control signals based on said pixel value sums; and
    (b) using said control signals to adjust at least one of intensity and duration of said laser beam.

* * * * *